United States Patent [19]

Shaw et al.

[11] Patent Number: 5,534,311
[45] Date of Patent: Jul. 9, 1996

[54] PRODUCTION OF STRUCTURES BY ELECTROSTATICALLY-FOCUSED DEPOSITION

[75] Inventors: Jonathan L. Shaw, Springfield; Henry F. Gray, Alexandria, both of Va.

[73] Assignee: The United States of America as represented by the Secretary of the Navy, Washington, D.C.

[21] Appl. No.: 454,982

[22] Filed: May 31, 1995

[51] Int. Cl.⁶ .................................................. B05D 3/06
[52] U.S. Cl. .................... 427/526; 427/527; 427/561; 427/563; 427/564; 427/581; 427/585; 427/596; 427/597
[58] Field of Search .................................. 427/526, 527, 427/561, 563, 564, 581, 585, 596, 597

[56] References Cited

U.S. PATENT DOCUMENTS

| | | | |
|---|---|---|---|
| 4,511,593 | 4/1985 | Brandolf | 427/561 |
| 4,876,112 | 10/1989 | Kaito et al. | 427/526 |
| 5,083,033 | 1/1992 | Komano et al. | 427/585 |
| 5,104,684 | 4/1992 | Tao et al. | 427/526 |

*Primary Examiner*—John Niebling
*Assistant Examiner*—Kishor Mayekar
*Attorney, Agent, or Firm*—Thomas E. McDonnell; Barry A. Edelberg

[57] ABSTRACT

Structures having a controlled three-dimensional geometry are deposited by electrostatically focused deposition using charged particle beam and gaseous precursors, or polarizable precursors with or without a charged particle beam. At least one apertured electrode is electrically biased with respect to the substrate surface. The resulting electrostatic field and field gradient focuses the charged particle beam or polarizable gaseous precursor molecules, and controls the three-dimensional geometry of the deposited structure. By this method, an array including many deposited structures may be simultaneously deposited on a single substrate. Thus, the disclosed method provides a fact and simple way of fabricating one or more arrays of three-dimensional structures. The method is particularly useful in the fabrication of arrays of sharp-tipped, cone-shaped conductive structures, such as field emitter tips and contacts.

25 Claims, 5 Drawing Sheets

PRODUCTION OF STRUCTURES BY ELECTROSTATICALLY-FOCUSED DEPOSITION

BACKGROUND OF THE INVENTION

1. Field of the Invention

The present invention relates generally to the deposition of structures and more specifically to the deposition of three-dimensional solid structures of controlled geometry at a specified point or points on a substrate surface.

2. Description of the Background Art

The controlled deposition of three-dimensional structures, with high spatial resolution, is desirable for various applications. These applications include the microfabrication of field emitter arrays, quantum dots, electrical contacts and microcircuits and other devices and components.

For example, the Field Emitter Array (FEA) is a microfabricated array of very small field emission sources and integrated extraction apertures. FEAs are significant for technology because they allow for the production of free electrons in a compact and manufacturable form, because the emission may be voltage modulated at high frequency and low voltage, and because they can have higher brightness, current density and total current than other types of electron sources. A number of device applications of great significance to the Navy and industry have been suggested, including flat panel displays and high frequency amplifiers. Current FEA fabrication technologies appear to be good enough to allow commercial production of flat panel cathodoluminescent displays, and an RF device demonstration effort is underway. However, improvements in a number of FEA properties would allow improved device characteristics.

An FEA may have either a vertical or a horizontal geometry. In both cases, the emitter structures may be either points (tips), edges, wedges, or other sharp structures. Edge structures are often much easier to fabricate than are points. All FEA designs must incorporate a non-intercepting electrode, called the gate, which is used to produce and modulate a high electric field at the emitter surface. A sharp emitter structure is located inside the aperture or slot, such that the field is concentrated at the sharp emitter tip or edge. Most applications benefit when the ratio of the field at the apex of the emitter to the voltage applied to the gate ($\beta$=F/V) is maximized. $\beta$ can be increased by reducing the size of the aperture and reducing the radius of curvature of the emitter. Point shaped emitters concentrate the field in almost three dimensions, whereas edges concentrate the field in only two dimensions. Thus point geometries will typically produce the highest $\beta$'s. Large values of $\beta$ reduce the power and voltage needed to operate FEA devices, and reduce the risk of failures due to dielectric breakdown or arcing. Present FEA fabrication techniques are producing emitter tips with radii near or below 100 Å. Applications which require high modulation frequency require low capacitance as well as high $\beta$. In particular, high frequency applications require a maximum ratio of transconductance to capacitance, achieved through a combination of high $\beta$, low emitter work function, high current density, high aspect ratio, large number of emitters, and geometry of field emitter and gate electrode. Many situations would also benefit from one or more additional apertures to accelerate, focus, or deflect the emitted beam. Most proposed FEA applications require a large number of emitters to produce sufficient current. If the current density must be high, or the capacitance must be low, it is important that a large fraction of the emitters in an array produce high current levels.

To achieve technologically significant levels of performance, new and innovative FEA fabrication methods and materials are required. The very sharp tip radii must be achieved through mechanisms such as etching, deposition, or growth, rather than direct lithography. Applications requiring the best possible emission transconductance demand that the emitting material have a low work function, reasonably inert surface, high electrical and thermal conductivity, as well as a very small radius of curvature. The maximum current density tolerated at the emitter tip should also be exceptionally high, up to $10^8$ A/cm$^2$, hence the bond strength, molecular weight, thermal conductivity, and fracture strength are important properties of the emitter material. In some applications the dielectric supporting the aperture must have high thermal conductivity, an ability to shed intercepted electrons, and good high temperature properties as well as high breakdown strength. Thus fabrication methods which allow the use of high quality materials are important for demanding applications.

Also, integrated circuits, such as a microprocessor, require connections to both power supplies and logic circuits. As the number of connections increases, so does the need for small, inexpensive contacts. The method of the present invention can provide contact structures, with high spatial resolution, at specific locations along the surface of an integrated circuit. When a contact structure of high aspect ratio and controlled angle of sharpness contacts the circuit, the insertion pressure causes the tip of the contact structure to scratch away or pierce any oxide coating that has built up at the contact point of the board, as well as pierce the underlying metal to be contacted. This scratching and piercing causes the formation of an electrical and physical contact. The sharpness and the high aspect ratio allow multiple, in plane contacts to made simultaneously, without non-contacting gaps due to local non-flatness.

Additionally, even where a sharp structure is not needed, the deposition of a material in a highly controllable manner is useful in the manufacture of quantum dot structures, and other devices and components that require the microfabrication of patterns with high spatial resolution.

SUMMARY OF THE INVENTION

Accordingly, it is an object of this invention to fabricate a controlled three-dimensional pattern upon a substrate.

It is another object of the present invention to form, upon the surface of a substrate, an array of structures having a high aspect ratio.

It is a further object of the present invention to form, upon the surface of a substrate, structures having tips with radii of no more than 150 Å and typically no more than 100 Å.

It is yet another object of at least one embodiment of the present invention to form a field emitter array in which the ratio of the electrostatic field at the apex of the emitter to the voltage applied to the gate is maximized.

It is a still further object of at least one embodiment of the present invention to form a field emitter array with integral, self-aligned focusing and extraction apertures.

It is a still further object of the present invention to concurrently deposit, on a substrate, a plurality of structures having a controlled three-dimensional geometry.

These and additional objects of the invention are accomplished, in one embodiment, by electrostatically focusing a charged particle beam upon a substrate having adsorbed precursor molecules thereon. The charged particle beam is focused by imposing a voltage between at least a portion of an apertured conductive member (e.g., a surface, layer, plate, or sheet, which may be flat, curved, shaped, or undulating, and which may be of about constant thickness or of varying thickness. Typically, the conductive member is flat and has a constant or about constant thickness) or a stacked set of conductive apertured structures and the substrate below. When one of the charged particles strikes a continually adsorbing precursor molecule, the adsorbed precursor molecule is transformed, by decomposition, into a solid material and volatile gases.

The physical structure and geometry of the deposited material is controlled, in three dimensions, by the initial particle beam energy, the voltages imposed on the substrate surface and the apertured conductive members, the distance between the apertured conductive members and the substrate surface, and the size of the aperture or apertures in the apertured conductive members. If desired, these parameters may be adjusted during deposition to provide an array of field emitters having their tips virtually level with, above or below the apertures in the first conductive member. In some circumstances, an array of field emitters having their tips virtually level with the apertures may be made without the need for adjusting the above parameters during deposition. Also, one or more additional electrodes may be used.

In another embodiment, ionized molecules or atoms may serve as both the precursor. and the charged particle beam. In these circumstances, the incident energy of the ionized molecules or atoms transforms them into the deposit. This transformation typically occurs without a "decomposition" step.

In yet another embodiment, patterning may occur when highly polarizable precursor molecules in the gas phase are attracted to the substrate, and focused, by the gradient of the electrostatic field. When gaseous polarizable precursor molecules Are used, the charged particle beam is not needed. Instead, the absorbed precursor molecules may be thermally decomposed or it can be decomposed by charged particles or by photons.

BRIEF DESCRIPTION OF THE DRAWINGS

A more complete appreciation of the invention will be readily obtained by reference to the following Description of the Preferred Embodiments and the accompanying drawings, wherein:

FIG. 4a shows the trajectories of charged particles passing through a 0.5 micron diameter aperture centered 1 micron above the flat substrate surface. In this example, the particles carry a charge of −1. The apertured electrode is at −100 V and the top electrode 404 is at −90 V with respect to the substrate 400. In FIGS. 4a and 4b, top electrode 404 is simulated rather than real. Top electrode 404 defines the electrostatic potential at that point in space. The initial kinetic energy of the charged particles, starting just below the surface of top electrode 404, is +19 eV, directed straight down toward the substrate, striking the deposit with an energy of 109 eV.

FIG. 5 shows the trajectories of charged particles passing through a 0.5 micron diameter aperture centered 1 micron above the flat substrate surface. A sharp tip extends from the substrate to the top surface of the apertured electrode. In this example, the particles carry a charge of −1. The apertured electrode is at −100 V and top electrode 505 is at −90 V with respect to the substrate. In FIG. 5, top electrode 505 is simulated rather than real. Top electrode 505 defines the electrostatic potential at that point in space. The initial kinetic energy of the charged particles, starting just below the surface of the top electrode, is +4 eV, directed straight down toward the substrate, striking the deposit with an energy of 94 eV.

DESCRIPTION OF THE PREFERRED EMBODIMENTS

Figure 1:
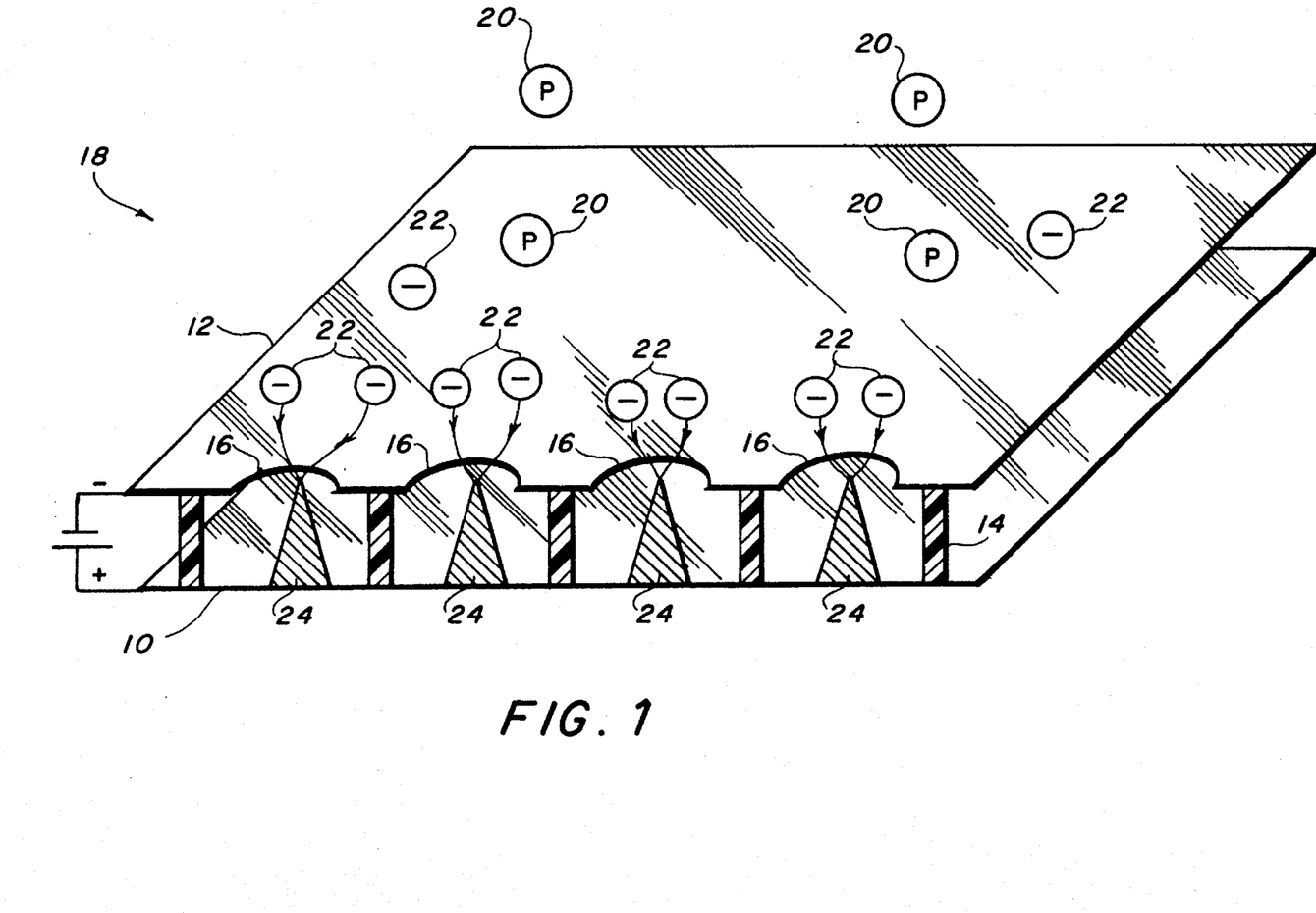
FIG. 1 is a schematic of the deposition process using an array of apertures in a single conductive focusing electrode.

A preferred embodiment of the present invention may be described by reference to FIG. 1. FIG. 1 shows the production of emitter tips during the fabrication of a field emitter array. Substrate 10 is spaced apart from grid 12 by a non-conductive spacer 14. Grid 12 includes an integral array of apertures 16, and is electrically biased with respect to substrate 10. While only a single layer of apertures 16 are shown in the figures of the present application, grid 12 (or any apertured electrode array used in any embodiment of the present invention) would typically be a large two dimensional array. Assembly 18 is enclosed within a vacuum chamber (not shown) and exposed to precursor molecules 20 in the gas phase. The surface of substrate 10 adsorbs precursor molecules 20. At the same time, a charged particle beam (in this case, electrons 22) is directed toward assembly 18. Because of the electrostatic potential imposed between grid 12 and substrate 10, an electrostatic field exists in the vicinity of apertures 16 and substrate 10, including areas between apertures 16 and substrate 10. This electrostatic field focuses the charged particle beam passing through apertures 16, much as a lens focuses a light beam.

Once the focused charged particle beam strikes the precursor molecules that are adsorbed on the surface of substrate 10, the precursor molecules decompose into volatile gases and the material to be deposited, for example, tungsten. At the focal point of each lens, which includes one of apertures 16, substrate 10 and any other aperture or electrode influencing the path of the charged particle beam, the charged particles passing through that focal point intersect. Beyond the focal point, the charged particles continue to diverge until they strike the substrate surface 10 or the growing structure forming by precursor decomposition. Once the charged particle beam strikes the precursor molecules adsorbed on the surface of substrate 10 or the growing structure forming by precursor decomposition, the precursor molecule decomposes into the material to be deposited and any gaseous by-products. Thus, if the focal point is held constant during deposition, the deposited material 24 is widest at its base, at the substrate surface, and narrowest at its tip, distal to the substrate surface.

The focal point of the lens, and thus the profile of the material deposited, varies predictably with changes in the electrostatic field in the vicinity of the aperture 16 and the position of the deposited material. This focal point may be inside the top surface of substrate 10 for focused deposition, above the top surface of substrate 10 for out-of-focus deposition, or well below the surface of substrate 10 for unfocused deposition. The strength of this electrostatic field may be adjusted by adjusting the voltage between substrate 10 and grid 12, and any other parameter that controls the characteristics (e.g., the beam energy spread) of the charged particle beam and the growing three-dimensional structure.

In some embodiments, the focusing characteristics of the lens and the three-dimensional profile of the deposit also depend on the distance between the end of the deposit distal to the substrate and aperture 16. If the voltage between grid 12 and substrate 10 remains unchanged throughout the formation of the deposit in these embodiments, the focal point of the lens will vary as the deposit 24 of material grows closer to aperture 16.

Either of two strategies effectively minimize or remove this problem of focal point shifting. In the first strategy, the energy of the beam, and/or the voltage between grid 12 and substrate 10, are continually adjusted during the formation process. This dynamic focusing compensates for the decreasing distance between the surface of the deposit and the grid 12, thus assuring the highest possible resolution. (In the case of emitter tip formation, the highest possible resolution corresponds to the smallest tip diameter.)

Figure 2:
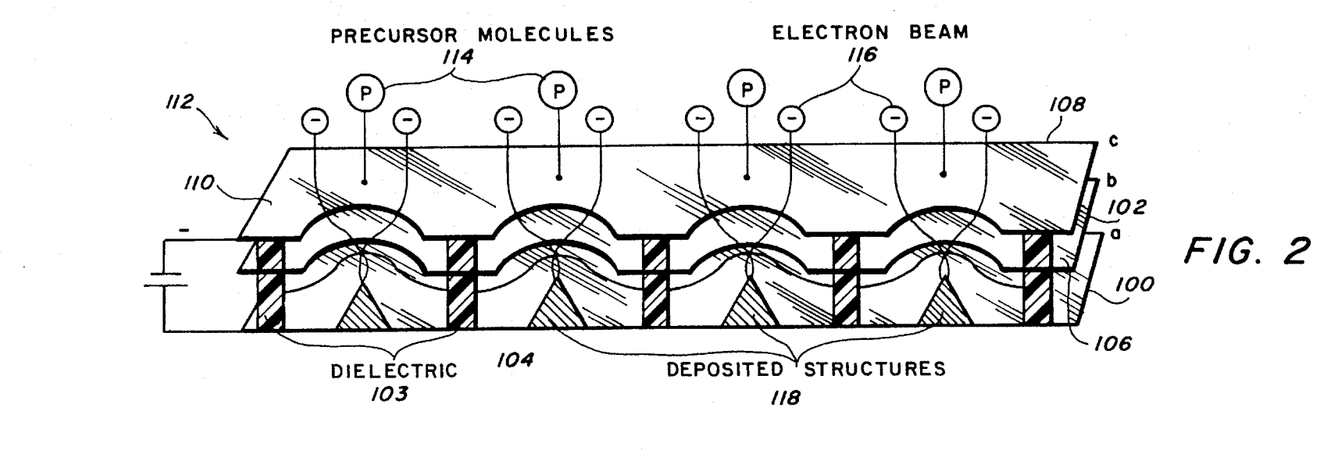
FIG. 2 is a schematic of the deposition process using arrays of apertures in two conductive electrodes to focus and control the charged particle trajectory.

The arrangement of FIG. 2 minimizes or avoids the problem of focal point shifting without the need for changing either the initial beam energy or the voltage between grid 102 and substrate 100. In the FIG. 2 embodiment, substrate 100 is spaced apart from grid 102 by non-conductive spacers 103. Grid 102 includes an integral array of apertures 104. Spacers 106 should provide spatial electrical isolation. Grid 108 includes apertures 110 vertically aligned with apertures 104. For the simplicity of illustration, FIG. 2 shows an embodiment where grid 102 and substrate 100 are maintained essentially equipotential with respect to each other, while a voltage is applied between grid 108 and substrate 100/grid 102. If desired, however, the structure of embodiment of FIG. 2 may be modified to permit the imposition of a voltage between grid 102 and substrate 100.

Assembly 112 is enclosed within a vacuum chamber (not shown) and exposed to precursor molecules 114. The surface of substrate 100 adsorbs precursor molecules 114. At the same time, a charged particle beam (in this case, electrons 116) is directed toward the substrate. Because of the electrical potential imposed between grid 108 and substrate 100, a focusing electrostatic field exists in the space between apertures 110 and apertures 104 and beyond. This electrostatic field focuses the beam of charged particles through apertures 104 of grid 102.

Once the focused charged particle beam strikes the adsorbed precursor molecules, which are continually adsorbed on the surface of substrate 100, the precursor molecules decompose into the material to be deposited, for example, tungsten. At the focal point of the each lens, which includes corresponding sets of aperture 110, aperture 104, substrate 100 and any other aperture or electrode influencing the path of the charged particle beam, the Charged particles passing through that focal point intersect. Beyond the focal point, the charged particles continue to diverge until they strike the substrate surface 100 or the growing structure forming by precursor decomposition. Once the charged particle beam strikes the precursor molecules adsorbed on the surface of substrate 100 or the growing three dimensional structure forming by precursor decomposition, the precursor molecule decomposes into the material to be deposited. Thus, the deposited structures 118 are widest at their bases, at the substrate surface, and narrowest at their tips, distal to the surface of substrate 100.

The use of apertures 110 and apertures 104, combined with substrate 100 and deposited structures 118, provides a compound electrostatic focusing lens and allows the top of deposits 118 to grow to sharpness, level with apertures 104, or other locations, without modifying the electrostatic applied voltage.

Figure 3:
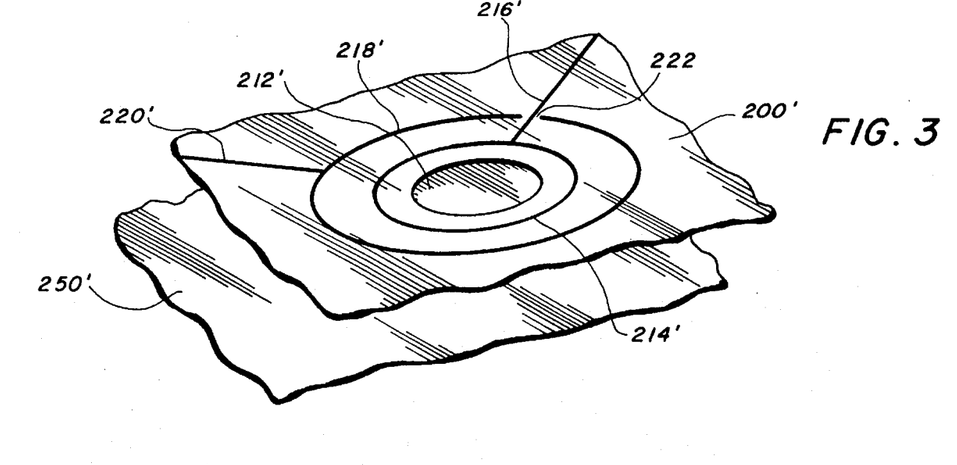
FIG. 3 is a schematic top view showing a single aperture and associated elements of an essentially planar, apertured structure useful in practicing the method of the present invention.

In the embodiment of FIG. 3 (which shows one representative aperture), dielectric (or other non-conductive material) layer 200' includes coplanar inner and outer conductive traces 214' and 218', respectively, extending annularly about aperture 212'. The inner and outer conductive traces 214' and 218' are in electrical contact with leads 216' and 220', respectively Lead 216' extends through a small opening 222 defined by outer conductive trace 218'. This arrangement electrically isolates inner conductive trace 214' and its associated lead 216' from outer conductive trace 218' and its associated lead 220'. (Other electrically equivalent schemes employing crossovers, bridges, etc., can be used to bring the appropriate leads out from the device structure). Thus, one may adjust the voltage between inner conductive trace 214' and substrate 250' independently of the voltage between outer conductive trace 218' and substrate 250'.

FIG. 3 shows an embodiment where the inner and outer annular conductive traces are essentially concentric with respect to each other and the aperture. The exact shape and location of these traces may be modified as required for particular applications.

If the charged particle beam as generated has an energy greater than what can be readily focused by the electrostatic field within the focusing apertures, the beam may be decelerated by interposing a decelerating field between the charged particle source and the focusing apertures. This decelerating or conditioning field may be imposed, for example, by the positioning of at least one additional apertured electrode between the charged particle source and the focusing apertures.

The action of the focusing apertures can be estimated by calculating the potentials in the space near apertures and substrate and plotting the trajectories of incident particles. These calculations have been performed numerically using the finite element electrostatic program SIMION (SIMION v5.0, Idaho National Engineering Laboratory, July 1991).

The dimensions in such a calculation are relative, so that the absolute dimensions of the aperture diameter and height do not affect the calculation. The effect of space charge is not independent of the scale of the calculation, but will be negligible so long as the electrostatic fields are kept high, which is typically true if the lens has micron scale dimensions. Thus the charged particle trajectories will scale along with the aperture size. The chromatic aberration of the lens is determined by the energy spread of the electron beam relative to the electrode potentials. Since the energy spread is practically fixed by the electron source (roughly 0.5 eV for thermionic electron sources), higher electrode potentials will tend to give better resolution, but the resulting increased impact energies will increase scattering effects. Given this trade-off, the trajectories of the charged particles focused according to the method of the present invention have been calculated assuming an accelerating potential of about 100 V. In practice, higher or lower potentials may be used, depending upon the results desired.

Figure 4A:
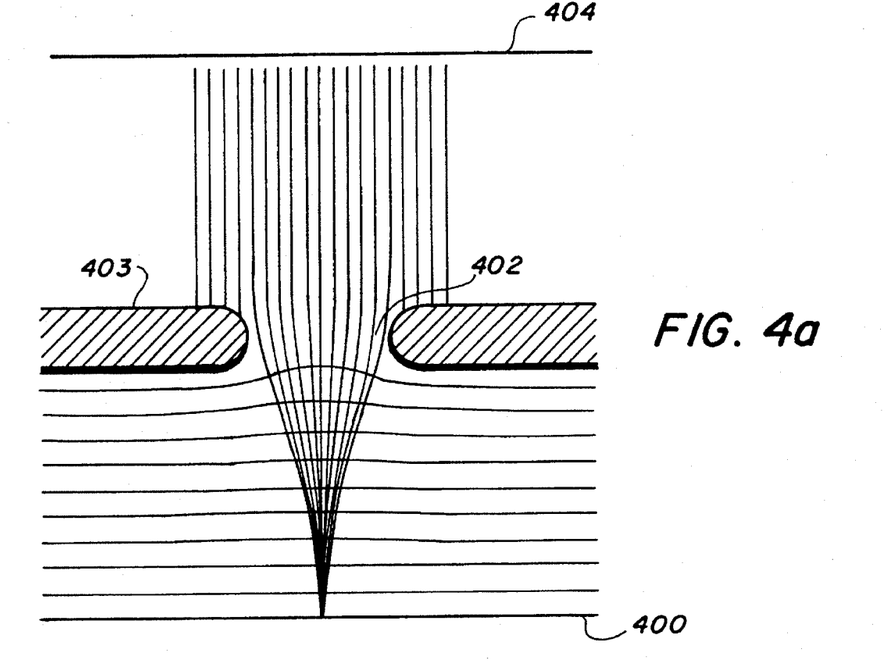
Figure 4B:
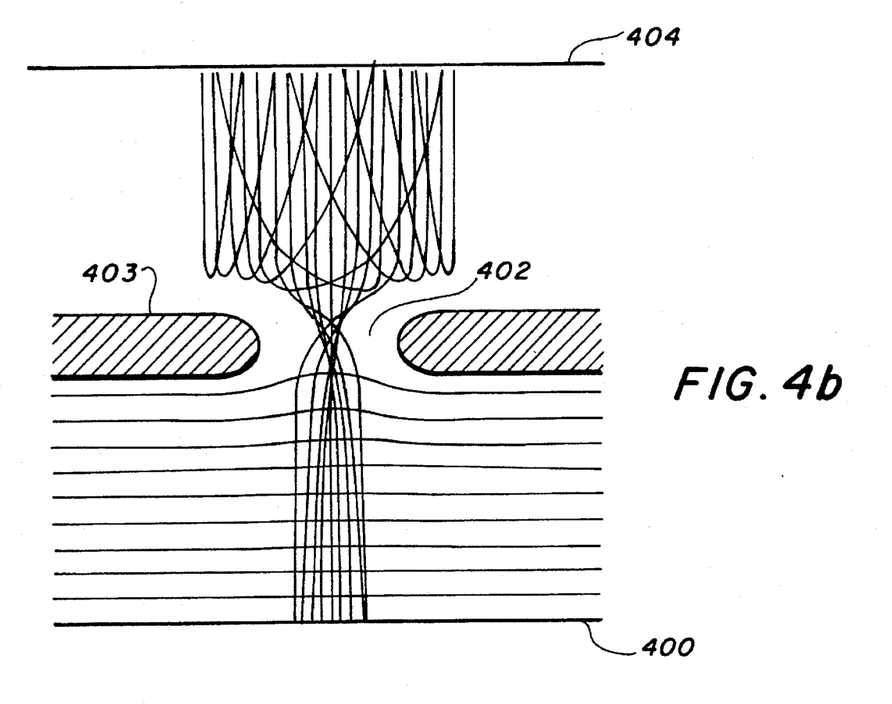
FIG. 4b shows the trajectories of charged particles passing through a 0.5 micron diameter aperture centered 1 micron above the flat substrate surface. In this example, the particles carry a charge of −1. The apertured electrode is at −100 V and top electrode 404 is at −90 V with respect to the substrate. The initial kinetic energy of the charged particles, starting just below the surface of top electrode 404, is +8 eV, directed straight down toward the substrate, striking the deposit with an energy of 98 eV.

FIGS. 4a and 4b show typical equipotential lines and charged particle trajectories calculated near a 0.5 micron diameter aperture 402 in electrode 403 one micron above a flat substrate 400. The mesh size (spatial resolution in the computer program) in this calculation was 100 Å. The electrode 403 is held at −100 eV relative to substrate 400, to create an accelerating electric field for electrons between as well as otherwise in the vicinity of electrode 403 and the substrate 400. A retarding field between electrode 403 and the charged particle source (not shown) is simulated by placing a third, top electrode 404 opposite electrode 403, at −90 V relative to substrate 400 (in practice this third, top electrode may be much further away and has a potential of about −2 kV). Charged particles are launched from third, top electrode 404 with various initial kinetic energies directed toward substrate 400 and parallel to the axis of the lens created by the electrostatic field near and between electrode 403 and substrate 400. Trajectories obtained by assuming initial kinetic energies equal to 19 eV (FIG. 4a) and 8 eV (FIG. 4b) are plotted. When the electron beam is focused onto the substrate as in (a), it will deposit a spatially defined amount of material; in this case, 20 nm in diameter. In order to build up a three-dimensional cone-like structure, the initial energy is reduced so that the trajectories intersect at a point closer to the plane of aperture 402. This situation is illustrated in FIG. 4b. Here, the initial kinetic energy is less than the retarding potential, hence electrons pass through aperture 402 by field penetration. No electrons will strike electrode 403 and no material will be decomposed on electrode 403. Instead, the material adsorbed on electrode 403 will eventually be desorbed.

Figure 5:
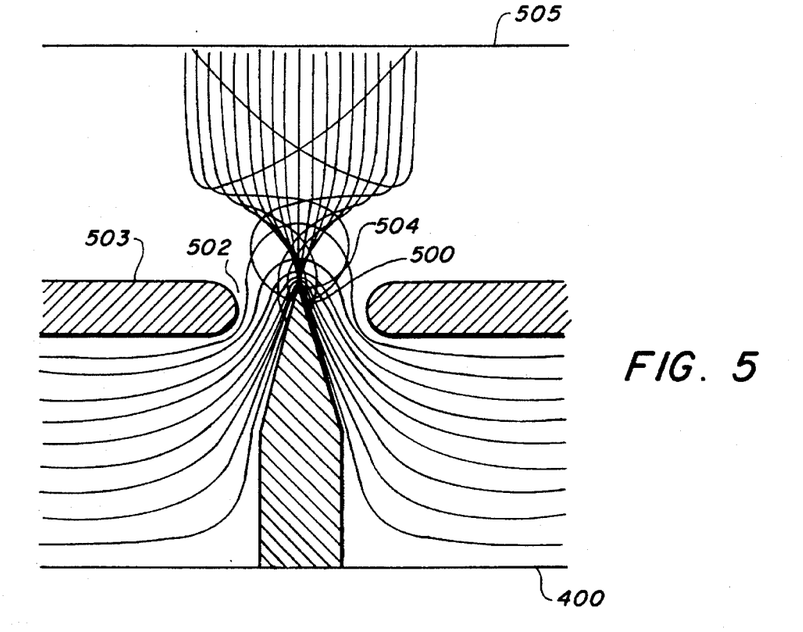

As the field emitter tip is built up, the potential contours are pushed into the aperture region, changing the lens' focusing properties. However, a sharp focus may still be obtained by reducing the initial energy. FIG. 5 shows trajectory calculations showing a good focus at the point of a field emitter tip 500 coplanar with the top of aperture 502 in electrode 503. The mesh pitch (square mesh) of the space used in the computer program was 50 Å. The initial energy was 4 eV. Trajectories for initial energies between 3.75 V and 4.25 V produce slightly larger focal areas, but most of the trajectories still intersect the 100 Å diameter spot at the end of tip 504. Thus an energy spread of 0.5 eV will produce a focal spot size less than 2% of diameter of aperture 502. Since an initial electron energy of 4 eV is insufficient to bring charge to the flat substrate as in FIG. 4b, the initial energy or the focusing voltage must be changed during the deposition in order to produce a tip as shown in FIG. 5

Figure 6:
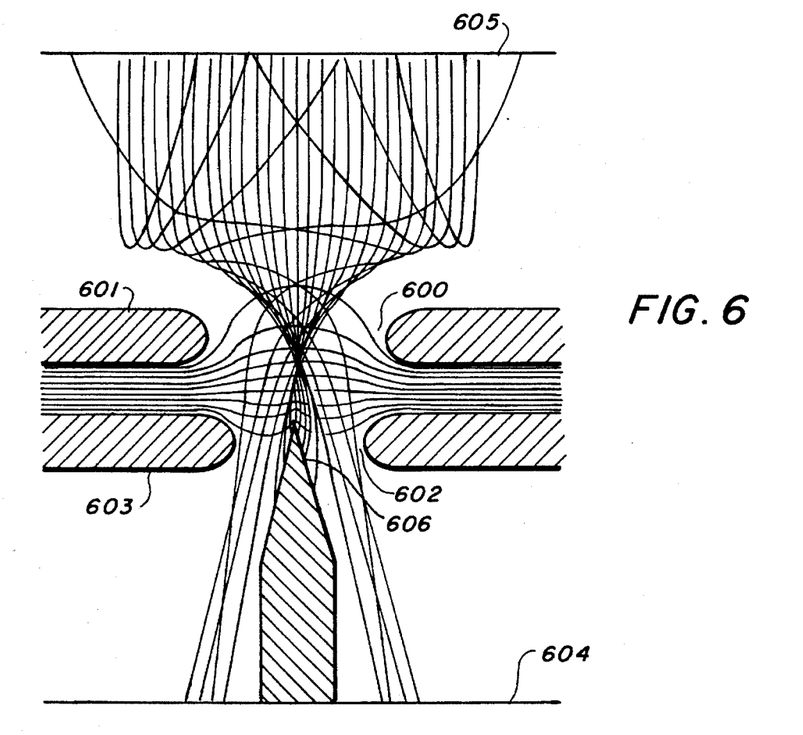
FIG. 6 shows the trajectories of charged particles passing through two electrodes having apertures 0.5 and 0.7 microns in diameter, centered 1.0 and 1.4 microns above the substrate surface, respectively. A sharp tip extends from the substrate surface to the top surface of the lower electrode. In this example, the particles carry a charge of −1. The lower electrode is at 0 V, the upper apertured electrode is at −100 V, and top electrode 605 is at −90 V with respect to the substrate. The initial kinetic energy of the charged particles, starting just below the surface of the top electrode is +7.75 eV directed straight down toward the substrate, striking the deposit with an energy of 97.75 eV.

The desired focal plane can be more easily placed at near the level of the first aperture by adding a second stacked aperture. FIG. 6 shows plots of the electron trajectories calculated for a geometry similar to that shown in FIG. 5, but with second electrode 601, having second aperture 600, added. The diameter of second aperture 600 is 1.4 microns, centered 0.4 microns above lower aperture 602 in first electrode 603. In this case, the lower aperture 603 is at 0 eV, the upper electrode 601 is at −100 eV and the top electrode 605 is at −90 V with respect to the substrate. The trajectories plotted are for an initial kinetic energy 7.75 eV, starting just below the surface of top electrode 605. Trajectories for initial energies between 7.5 eV and 8.0 eV also produce trajectories which intersect the 100 Å diameter spot at the end of tip 606. Using a constant initial energy of 7.75 eV throughout the deposition will produce a satisfactorily sharp tip.

The precursors used in the method of the present invention should desorb from the deposition surface slowly, to maximize the likelihood that the particle beam will strike and decompose a precursor molecule adsorbed on the surface of the deposition substrate. Additionally, it is generally, but not always, desirable for the precursor molecule to decompose into a byproduct or byproducts that are desorbed from the surface at a rate sufficiently fast to avoid their incorporation into the deposited material. Precursors selected for use in the method of the present invention typically desorb at rates below about 0.1 ml/s (assuming $10^{-6}$ torr pressure, or 1 ml/s flux) and produce decomposition byproducts with a high desorption rate, typically above about 10 ml/s at the deposition conditions.

In the present case, relatively low temperatures may be required to induce adsorption of the precursor. These low temperatures (typically below about 100° C.) will not typically allow desorbtion of common decomposition ligands such as CO or $CH_3$ at sufficient rates. Hence some of the carbon contained in the parent molecule can be expected to be incorporated in the deposit. The resulting deposit would probably have a greater resistivity relative to that of a pure metal, but would be useful for some FEA applications such as displays requiring low and uniform emission current. Significant impurity (carbon) content will also tend to prevent the formation of crystal grains, and thus may improve the uniformity of extremely small structures. Higher bulk conductivity (lower carbon content) might be achieved by using metal hydride or halide precursors (e.g., $WF_6$, $MoF_6$, $WCl_6$, $TiF_4$, $TiCl_4$, $SnCl_4$, $NbF_5$, $NbCl_5$, $TaF_5$, $TaCl_5$, $SiH_4$, $Si_2H_6$) whose decomposition ligands are more volatile or can adsorb adequately at a higher temperature.

If desired, a mixture of precursors may be used, to form an alloy, compound, composite material or simply a mixture. For example, compounds., including TiN, might be produced from combinations of precursors such as $TiCl_4$ and $NH_3$. Additionally, the precursor or precursors used may be changed during the deposition to provide a deposit having a correspondingly varied composition. This strategy may be used to avoid thermal mismatch, increase adhesion, change the electrical properties of the material, provide mechanical or chemical stability or provide low work function.

Any solid material for which suitable precursors exist can be deposited according to the method of the present invention. For many uses, such as a field emitter array, the material deposited will be either electrically conductive (i.e., metallic, electrically resistive, or semiconducting). Provided appropriate (e.g. polarizable) precursors are used, the deposits may even be electrically insulating.

Figure 7:
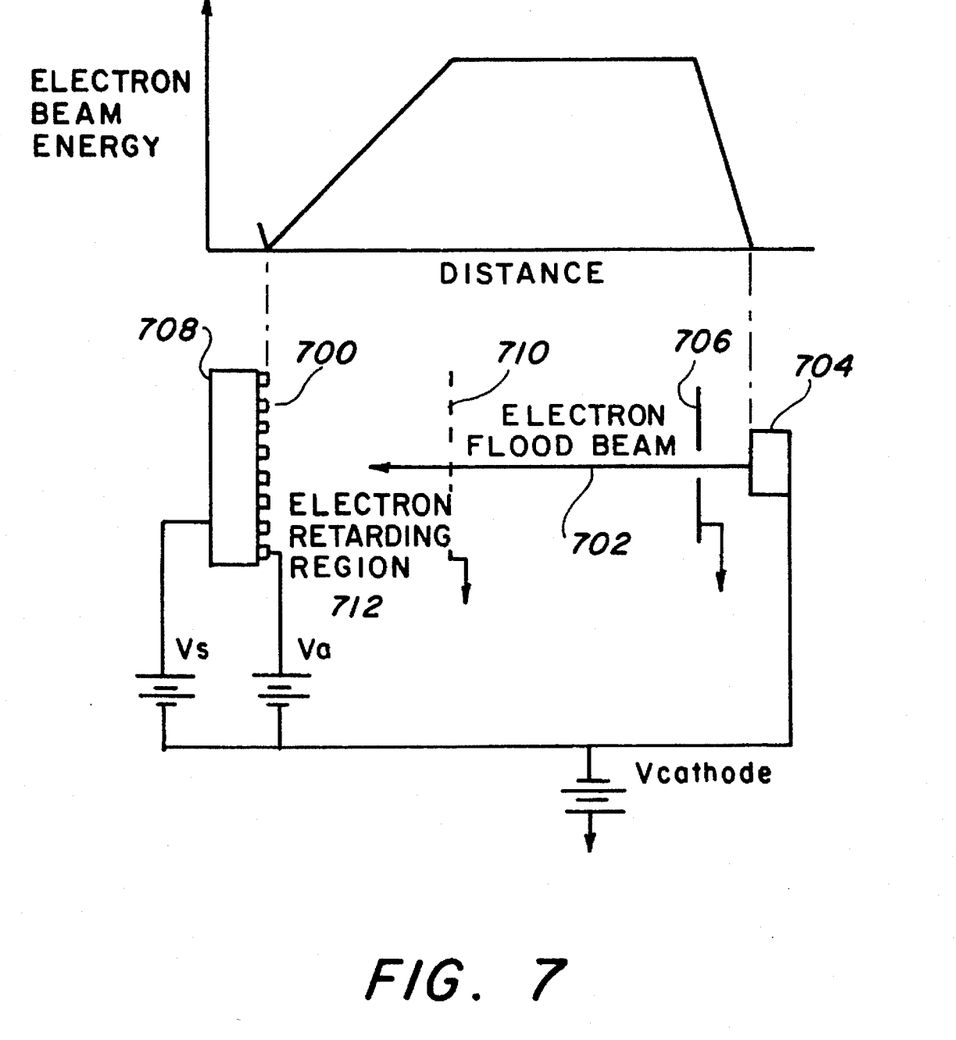
FIG. 7 is a schematic representation of the energies throughout the path of a negatively charged particle from source to substrate, and a representation of that path.

Ion and electron-beam deposition methods using remotely focused beams appear to be relatively immune from high pressure (above about $10^{-5}$ torr) ionization effects because of the lack of an electric field in the vicinity of the substrate, and the relatively narrow particle beam. In the present invention, however, the accelerating field for positive ions in the region 712 (FIG. 7) between the grounded grid and the apertured array 700 pushes any ions created toward the apertured array 700 and substrate 708.

During deposition, the pressure of the gaseous precursor molecules should be sufficiently low to prevent significant decomposition of the precursor molecules in the gas phase. Significant decomposition of the gaseous precursor molecules in the gas phase will noticeably interfere with controlled deposition. Typically, the precursor pressure during deposition is maintained below about $10^{-4}$ torr.

The substrate need not be integral to the remainder of the lensing structure (i.e., grids, spacers, electrodes, etc.). A single lensing structure may be used to deposit a pattern upon one substrate, removed from that substrate, and then used to provide the same pattern upon a subsequent substrate. Thus, a plurality of substrates could be patterned, in assembly line fashion, from a single lensing structure.

Additionally, a single lens array may be used to create deposited structures in a variety of patterns. To accomplish this result, voltages may be selectively applied to electrostatic lenses located in multiple areas. By applying appropriate voltages to apertures in areas where deposited structures are and are not desired, varied patterns of deposits may be formed with a single aperture layout. The lens structure may be fabricated with multiple conducting leads (traces) to multiple electrically isolated areas on the aperture array to allow application of different voltages to selected areas. Electric isolation may be accomplished by including at least one layer of dielectric material in the lensing structure, supporting a conducting (e.g. metal) layer, which may be patterned to form the electrodes corresponding to each aperture, and the conducting leads (traces) connecting various aperture electrodes with each other and to contact areas. The aperture electrodes may extend annularly around each aperture on either the horizontal surface of the dielectric material or the vertical edge defining the aperture.

Deposition sites may be selected individually with fewer contacts than the number of sites by employing at least two individually contacted electrodes per site and connecting the electrodes in intersecting lines such as rows and columns or another planar geometry, such that individual lenses operate only when proper voltages are applied to two or more electrodes simultaneously. The electrodes may be either within a single plane or on multiple aperture planes; these planes may include the substrate. When a multiple electrode addressing scheme (typically two coordinate addressing, such as x-y addressing) is used, only a fraction of the total number of lenses will function simultaneously, hence the total deposition time will be lengthened accordingly.

Where the substrate is integral to the apertured electrode, the method of the present invention can advantageously produce a structure with self-aligned focusing and extraction apertures. These self-aligned structures are useful, for example, in flat panel displays.

In another embodiment of the present invention, precursor molecules may be polarizable. Polarizable molecules accelerate along the gradient of an electrostatic field are thereby focused and finally adsorb on the surface of the substrate in a focused manner. Because the electric field gradient directly acts on and focuses the polarizable precursor molecules, a charged particle beam is unnecessary. Instead, the polarizable precursor molecules continually adsorbed onto the substrate may be thermally (or by photons or charged particles) decomposed to provide the desired controlled deposit.

Having described the invention, the following examples are given to illustrate specific applications of the invention. These preferred examples are not intended to limit the scope of the invention described in this application.

EXAMPLES

Apparatus

A macroscopic model of the envisioned micron-scale apertures (schematically illustrated in the bottom portion of FIG. 7) was used to verify that the local focusing method can indeed produce patterned deposits. Apertured array 700 consisted of a 12 micron thick Ni sheet with 25 micron square holes on 50 micron centers. Apertured array 700 was suspended by a 50 micron thick dielectric sheet over a polished n-type silicon wafer. This arrangement caused the distance between the apertured array 700 and the silicon wafer to be somewhat non-uniform across the exposed area of approximately 10 mm$^2$. Electron beam 702 from cathode 704 held at large negative potential (e.g, −1800 V) was passed through gun aperture 706 (held at ground potential) into a field free region between the gun and, grid 710, also at ground potential. In the region between grid 710 and aperture array 700 the beam was decelerated to a small positive potential with respect to the cathode (e.g. +9 or +75 V). To keep the retarding field in this region high, the grid 710 was placed close to aperture array 700, e.g. 5–10 mm. In the space between the aperture array 700 and substrate 708, the beam is again accelerated to a large positive potential with respect to aperture array 700 (e.g, substrate at +75 V if aperture array 700 is at +9 V or +1000 V if 700 is at +75 V (potentials measured with respect to the cathode 704)). Prior to deposition the vacuum chamber was baked and evacuated with an 80 l/s ion pump (not shown) to <5×10$^{-8}$ torr. A cold cathode ion gauge (not shown) was used to measure the chamber pressure during deposition. The precursor gas was introduced through a 3 mm i.d. tube (not shown) terminating about 10 mm from the wafer. This arrangement enhances the ratio of fresh precursor to background gases and increases the local pressure of precursors near the sample surface over the pressure measured at the gauge. Silicon wafer 708 was placed on a copper pedestal (not shown), which was cooled during deposition to −100 C by connection to a liquid nitrogen reservoir (not shown). The electron gun having a thermionic cathode (not shown) was located in a second ion pumped chamber and the electron beam passed through an aperture (not shown) separating the chambers.

EXAMPLE 1

Patterned Deposition Produced by the Decomposition of Diethylsilane

The substrate and apertured electrode were maintained at +1000 and +75 V, respectively, with respect to the cathode. Thus the focusing conditions were similar to the simulation shown in FIG. 4a. The precursor pressure was maintained at 5×10$^{-7}$ torr during the deposition, and the electron current to the silicon was 5 μA, giving an electron flux of ~5×10$^{15}$ e$^-$cm$^{-2}$s$^{-1}$. The total beam current was 150 μA, but was defocused over an area much larger than the exposed Si. The deposition time was 90 minutes. The deposit was thickest in the center, where it was roughly 0.5 microns thick. The deposition rate was thus approximately 1 Å/s. The square aperture holes produced a four-fold symmetry in the pattern, was visible as an X shape in the central portion of the deposit. The edge of the X shape was less than 0.5 μm wide, or 50 times smaller than the apertures.

EXAMPLE 2

Vertically Oriented Cross Shaped Deposits Produced by Reducing the Ratio of Substrate to Aperture Potential The substrate and aperture potentials were +75 V and +9 V, respectively, the current was 1.5 μA, the deposition time was 15 minutes, and the precursor was tetrakis-diethylamino-titanium at $2 \times 10^{-7}$ torr pressure. (Using diethylsilane at these potentials resulted in similar shapes.) The lower ratio of substrate to aperture voltage produced significantly less focusing action than obtained in Example 1, as expected. Auger electron spectroscopy analysis of the deposited films indicated they were primarily carbon, with significant (~10–20%) concentrations of silicon (from diethylsilane) and nitrogen and titanium (from tetrakis-diethyl amino-titanium), but contained very little oxygen contamination.

Additional material was deposited in an unfocused or defocused pattern around each spot when the (measured) gas pressure was increased above the high $10^{-7}$ torr range. The amount of this unpatterned material increased with higher precursor pressures. This effect probably resulted from positive ions, created from gas phase precursor molecules by the electron beam, and defocused by the electrostatic lens. In order for the ionized species to be drawn toward the substrate, the ionization must occur in the region between the focusing aperture (held at high voltage) and the grounded grid above it, since there is a strong attracting electric field in this space (see FIG. 7). For convenience during this development, the distance between the grounded grid and the aperture was kept large, (several mm) and hence the volume where ionization could occur was large. An improved system, with a grid spaced more closely to, or integrated with, the substrate, could possibly reduce this volume by a factor of up to about 1000. Thus the maximum precursor pressure tolerable without gas phase ionization should also go up by a factor of about 1000, e.g., $10^{-4}$ torr.

The results of Examples 1 and 2 show that patterned deposition using local electrostatic focusing can be done in the manner proposed. Since the electron trajectories will scale with the size of the aperture, a micron-scale aperture array exposed to an electron beam and precursor flux in a similar manner should produce deposits which are proportionately smaller, but will build up much larger aspect rations in similar deposition times.

Obviously, many modifications and variations of the present invention are possible in light of the above teachings. It is therefore to be understood that, within the scope of the appended claims, the invention may be practiced otherwise than as specifically described.

What is claimed is:

1. A method of depositing a material upon a substrate so as to form a deposit having a controlled three-dimensional geometry, comprising the steps of:

providing a conductive substrate having a surface upon which said material is to be deposited;

positioning a first conductive member, having a first aperture therein, opposite, spaced apart from, electrically isolated from, and essentially parallel to said substrate surface;

electrically biasing at least a portion of said first conductive member with respect to said substrate surface by applying a voltage therebetween, so as to form a first electrostatic focusing field in the vicinity of said first aperture and said substrate surface;

exposing said substrate surface to a flux of a gaseous precursor, whereupon said precursor attaches to said substrate surface;

directing a charged particle beam, comprising charged particles, through said first aperture and onto said substrate surface, whereupon said attached precursor is transformed into a deposit of said material upon said substrate surface;

focusing said charged particle beam passing through said first aperture, so that said charged particles intersect at a focal point, by regulating said voltage between said portion of said first conductive member and said substrate surface, thus regulating said first electrostatic focusing field in the vicinity of said first aperture and said substrate, so as to control the geometry of said deposit of said material upon said substrate surface.

2. The method of claim 1, wherein said flux of a gaseous precursor is a flux of gaseous precursor molecules, said exposing step results in said gaseous precursor molecules adsorbing upon said substrate surface, said charged particle beam strikes said adsorbed precursor molecules, and said charged particle beam, upon striking said adsorbed precursor molecules, decomposes said adsorbed precursor molecules into said material deposited upon said substrate.

3. The method of claim 1, wherein said flux of said gaseous precursor comprises said charged particle beam, and said charged particle beam strikes said substrate surface or a deposit of material on said substrate surface and, upon striking said substrate surface or said deposit of said material on said substrate surface, is transformed into said material deposited upon said substrate.

4. The method of claim 1, wherein said first conductive member is electrically isolated from said substrate surface.

5. The method of claim 1, wherein said first conductive member includes an array of apertures therein.

6. The method of claim 5, wherein said apertures in said array are addressable in a two-coordinate system.

7. The method of claim 5, wherein said material is deposited upon said substrate surface as a shaped three-dimensional set of structures.

8. The method of claim 7, wherein said set of structures is an array of physically sharp structures having bases attached to said substrate surface and tips distal to said substrate surface and said bases.

9. The method of claim 8, wherein said tips have radii of about 150 Å or less.

10. The method of claim 9, wherein said tips have radii of about 100 Å or less.

11. The method of claim 1, wherein said deposition is performed in a vacuum chamber within which the gaseous precursor form a gas phase having a pressure sufficiently low to essentially prevent decomposition of the gaseous precursor in the gas phase.

12. The method of claim 1, wherein said material deposited is an electrically conductive material.

13. The method of claim 1, wherein said material deposited is an electrically resistive material.

14. The method of claim 1, wherein said material deposited is a semiconducting material.

15. The method of claim 1, further comprising the steps of:

positioning a second conductive member, having a second aperture therein, opposite, spaced apart from, electrically isolated from, and essentially parallel to said substrate surface and said first conductive member, said first aperture and said second aperture defining a path for the flow of charged particles therethrough and onto said substrate surface;

electrically biasing at least a portion of said second conductive member with respect to said substrate surface, said electrically biased portion of said first conductive member, or both said substrate surface and said first conductive member;

directing said charged particle beam through said second aperture and first aperture and onto said substrate surface.

16. The method of claim 1, wherein said first conductive member comprises:

a dielectric material having thereon:
an inner annular conductive trace extending about said first aperture and in electrical contact with a first lead, and
a outer annular conductive trace extending about said first aperture, outside said inner annular trace and in electrical contact with a second lead;

and wherein said portion of said first conductive member is electrically biased with respect to said substrate surface by imposing a voltage between said inner annular conductive trace and said substrate surface and between said outer annular conductive trace and said substrate surface.

17. A method of depositing a material, comprising decomposed precursor molecules, upon a substrate surface so as to form a deposit having a controlled three-dimensional geometry, comprising the steps of:

providing a conductive substrate having a surface upon which said material is to be deposited;

positioning a first conductive member, having a first aperture therein, opposite, spaced apart from, electrically isolated from, and essentially parallel to said substrate surface;

electrically biasing at least a portion of said first conductive member with respect to said substrate surface by applying a voltage therebetween, so as to form a first electrostatic focusing field gradient between said first aperture and said substrate surface;

exposing said substrate surface to a flux of polarizable gaseous precursor molecules, whereupon said first electrostatic focusing field gradient directs said precursor molecules towards a specific location on said substrate surface, at which location said precursor molecules are adsorbed upon said substrate surface;

decomposing said adsorbed precursor molecules to form a deposit of said material upon said substrate surface;

focusing said flux of polarizable gaseous precursor molecules, so that said polarizable gaseous precursor molecules intersect at a focal point, by regulating said voltage between said portion of said first conductive member and said substrate surface, thus regulating said first electrostatic focusing field gradient, so as to control the size and shape of said deposit of said material upon said substrate surface.

18. The method of claim 17, wherein said material deposited is an electrically insulating material.

19. The method of claim 17, wherein said material deposited is electrically conductive.

20. The method of claim 17, wherein said first conductive member includes a plurality of apertures therein.

21. The method of claim 17, wherein said adsorbed precursor molecules are thermally decomposed.

22. The method of claim 17, further comprising the steps of:

positioning a second conductive member, having a second aperture therein, opposite, spaced apart from, electrically isolated from, and essentially parallel to said substrate surface and said first conductive member, said first aperture and said second aperture defining a path for the flow of charged particles therethrough and onto said substrate surface;

electrically biasing at least a portion of said second conductive member with respect to said substrate surface, said electrically biased portion of said first conductive member, or both said substrate surface and said first conductive member;

directing said flux of polarizable gaseous precursor molecules through said second aperture and first aperture and onto said substrate surface.

23. The method of claim 17, wherein said conductive surface comprises:

a non-conductive material having thereon:
an inner annular conductive trace extending annularly about said first aperture and in electrical contact with a first lead, and
an outer annular conductive trace annularly extending about said first aperture, outside said inner annular conductive trace and in electrical contact with a second lead;

and wherein said portion of said first conductive member is electrically biased with respect to said substrate surface by applying an electrical voltage to said inner annular conductive trace and said outer annular conductive trace.

24. The method of claim 1, wherein said focal point is downstream from said first aperture.

25. The method of claim 17, wherein said focal point is downstream from said first aperture.

* * * * *